US012768915B2

(12) United States Patent
Colard et al.

(10) Patent No.: US 12,768,915 B2
(45) Date of Patent: Oct. 20, 2026

(54) SENSOR DEVICE FORMED OF DIAMOND MATERIAL

(71) Applicant: ELEMENT SIX TECHNOLOGIES LIMITED, Didcot Oxfordshire (GB)

(72) Inventors: Pierre-Olivier François Marc Colard, Didcot Oxfordshire (GB); Andrew Mark Edmonds, Didcot Oxfordshire (GB); Matthew Lee Markham, Didcot Oxfordshire (GB)

(73) Assignee: ELEMENT SIX TECHNOLOGIES LIMITED, Didcot Oxfordshire (GB)

( * ) Notice: Subject to any disclaimer, the term of this patent is extended or adjusted under 35 U.S.C. 154(b) by 248 days.

(21) Appl. No.: 18/721,289

(22) PCT Filed: Dec. 19, 2022

(86) PCT No.: PCT/EP2022/086750

§ 371 (c)(1),
(2) Date: Jun. 18, 2024

(87) PCT Pub. No.: WO2023/117973

PCT Pub. Date: Jun. 29, 2023

(65) Prior Publication Data

US 2025/0052839 A1 Feb. 13, 2025

(30) Foreign Application Priority Data

Dec. 21, 2021 (GB) ...................................... 2118621

(51) Int. Cl.
*G01V 3/00* (2006.01)
*G01R 33/00* (2006.01)
*G01R 33/26* (2006.01)

(52) U.S. Cl.
CPC ......... *G01R 33/26* (2013.01); *G01R 33/0052* (2013.01)

(58) Field of Classification Search
CPC ........ A61B 5/245; A61B 5/0042; A61B 5/055
(Continued)

(56) References Cited

U.S. PATENT DOCUMENTS 10,274,551 B2 4/2019 Hruby et al.
2018/0275220 A1 * 9/2018 Hahn ..................... G01R 33/26
2020/0347515 A1 11/2020 Markham et al.

FOREIGN PATENT DOCUMENTS

CN 104602634 B * 10/2017 ............. A61B 5/283
EP 3851863 A1 7/2021
(Continued)

OTHER PUBLICATIONS

Murooka, T et al. “Photoelectrical detection of nitrogen-vacancy centers by utilizing diamond lateral p-i-n diodes,” Applied Physics Letters, American Institute of Physics, 118(25): 253502 (2021).
(Continued)

*Primary Examiner* — Walter L Lindsay, Jr.
*Assistant Examiner* — Frederick Wenderoth
(74) *Attorney, Agent, or Firm* — Armstrong Teasdale LLP

(57) ABSTRACT

A sensor device formed of diamond material. The sensor device has a spin defect located in the diamond material, and an electrically conducting region located so as to be interactable with the spin defect. The electrically conducting region extends from an interior location of the diamond material to a surface of the diamond material. The electrically conducting region at the surface of the diamond material is arranged to connect to a detector, the detector configured to detect charge carriers excited from the at least one spin defect via the electrically conducting region. This allows the use of a higher volume of the diamond sensor than would be the case if one were limited to using spin defects close to the surface.

14 Claims, 3 Drawing Sheets

(58) Field of Classification Search
USPC .......................................................... 324/304
See application file for complete search history.

(56) References Cited

FOREIGN PATENT DOCUMENTS

| | | | | | |
|---|---|---|---|---|---|
| GB | 2570583 | A | * | 7/2019 | ............ C30B 33/12 |
| RU | 2465377 | C1 | * | 10/2012 | |
| WO | 2010010344 | A1 | | 1/2010 | |
| WO | 2010010352 | A1 | | 1/2010 | |
| WO | 2010149775 | A1 | | 12/2010 | |
| WO | 2014044607 | A1 | | 3/2014 | |
| WO | WO-2017173548 | A1 | * | 10/2017 | ............ G01R 33/24 |
| WO | 2023117973 | A1 | | 6/2023 | |

OTHER PUBLICATIONS

Forneris, J. et al. "Electrical control of deep NV centers in diamond by means of sub-superficial graphitic micro-electrodes," Carbon 113: 76-86 (2017).
Bourgeois, E. et al. "Photoelectric detection of electron spin resonance of nitrogen-vacancy centres in diamond," Nature Communications, 6(1): 8577 (2015).
Bloomer, C. et al. "A single crystal CVD diamond x-ray beam diagnostic with embedded graphitic wire electrodes," AIP Conference Proceedings. 2054(1): 060058-1 to 060058-6, AIP Publishing (2019).
GB Search Report issued for Application No. GB 2118621.8, dated May 10, 2022 (4 pages).
PCT International Search Report issued for Application No. PCT/EP2022/086750, dated Mar. 27, 2023 (14 pages).

* cited by examiner

SENSOR DEVICE FORMED OF DIAMOND MATERIAL

CROSS-REFERENCE TO RELATED APPLICATIONS

This application is a § 371 national stage of International Application No. PCT/EP2022/086750, filed Dec. 19, 2022, which claims priority to Great Britain Application No. 2118621.8, filed Dec. 21, 2021.

BACKGROUND

The invention relates to the field of sensor devices, in particular sensor devices formed from diamond material.

Point defects in synthetic diamond material, particularly quantum spin defects and/or optically active defects, have been proposed for use in various imaging, sensing, and processing applications including: luminescent tags; magnetometers; spin resonance devices such as nuclear magnetic resonance (NMR) and electron spin resonance (ESR) devices; spin resonance imaging devices for magnetic resonance imaging (MRI); quantum information processing devices such as for quantum communication and computing; magnetic communication devices; and gyroscopes for example.

It has been found that certain defects are particularly useful for sensing and quantum processing applications when in their negative charge state. For example, the negatively charged nitrogen-vacancy defect ($NV^-$) in synthetic diamond material has attracted a lot of interest as a useful quantum spin defect because it has several desirable features including:

- (i) Its electron spin states can be coherently manipulated with high fidelity and have an extremely long coherence time (which may be quantified and compared using the transverse relaxation time $T_2$ and/or $T_2$*);
- (ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and
- (iii) Its electronic structure comprises emissive and non-emissive electron spin states, which allows the electron, spin state of the defect to be read out through photons. This is convenient for reading out information from synthetic diamond material used in sensing applications such as magnetometry, spin resonance spectroscopy, and imaging. Furthermore, it is a key ingredient towards using $NV^-$ defects as qubits for long-distance quantum communications and scalable quantum computation. Such results make the NV defect a competitive candidate for solid-state quantum information processing (QIP).

The $NV^-$ defect in diamond consists of a substitutional nitrogen atom adjacent to a carbon vacancy. Its two unpaired electrons form a spin triplet in the electronic ground state ($^3$A), the degenerate $m_s=\pm1$ sublevels being separated from the $m_s=0$ level by 2.87 GHz. The electronic structure of the NV defect is such that the $m_s=0$ sublevel exhibits a high fluorescence rate when optically pumped. In contrast, when the defect is excited in the $m_s=\pm1$ levels, it exhibits a higher probability to cross over to the non-radiative singlet state ($^1$A) followed by a subsequent relaxation into $m_s=0$. As a result, the spin state can be optically read out, the $m_s=0$ state being "bright" and the $m_s=\pm1$ states being dark. When an external magnetic field or strain field is applied, the degeneracy of the spin sublevels $m_s=\pm1$ is broken via Zeeman splitting. This causes the resonance lines to split depending on the applied magnetic/strain field magnitude and its direction. This dependency can be used for magnetometry by probing the resonant spin transitions using microwaves (MW) and using optically detected magnetic resonance (ODMR) spectroscopy to measure the magnitude and, optionally, the direction of the applied magnetic field.

$NV^-$ defects in synthetic diamond material can be formed in a number of different ways including:

- (i) formation during growth of the synthetic diamond material where a nitrogen atom and a vacancy are incorporated into the crystal lattice as a nitrogen-vacancy pair during growth;
- (ii) formation after diamond material synthesis from native nitrogen and vacancy defects incorporated during the growth process by post-growth annealing the material at a temperature (around 800° C.) which causes migration of the vacancy defects through the crystal lattice to pair up with native single substitutional nitrogen defects;
- (iii) formation after diamond material synthesis from native nitrogen defects incorporated during the growth process by irradiating the synthetic diamond material to introduce vacancy defects and then subsequently annealing the material at a temperature which causes migration of the vacancy defects through the crystal lattice to pair up with native single substitutional nitrogen defects;
- (iv) formation after diamond material synthesis by implanting nitrogen defects into the synthetic diamond material after diamond material synthesis and then annealing the material at a temperature which causes migration of the native vacancy defects through the crystal lattice to pair up with implanted single substitutional nitrogen defects; and
- (v) formation after diamond material synthesis by irradiating the synthetic diamond material to introduce vacancy defects, implanting nitrogen defects into the synthetic diamond material before or after irradiation, and annealing the material at a temperature which causes migration of the vacancy defects through the crystal lattice to pair up with implanted single substitutional nitrogen defects.

Various different types of diamond material have been disclosed in the prior art for use in various different types of magnetometry applications including WO2010/010352 and WO2010/010344 which disclose low nitrogen content single crystal chemical vapour deposited (CVD) diamond materials for applications such as magnetometry, and WO2010/149775 which discloses irradiated and annealed single crystal CVD diamond materials for applications such as magnetometry.

A limitation of ODMR, described above, is that the intensity of photoluminescence saturates at high pump powers. Furthermore, the collection efficiency of ODMR can be limited by the high refractive index of diamond.

Photoelectric Detection of Magnetic Resonance (PDMR) has been proposed as an alternative to ODMR, which allows the direct photoelectric measurement of the spin state of a spin defect in a diamond lattice, based on the detection of charge carriers generated by excited spin centres. This technique is described in Bourgeois, E. et. al., "Photoelectric detection of electron spin resonance of nitrogen-vacancy centres in diamond". Nature Communications, 6, 2015 and U.S. Pat. No. 10,274,551. An advantage of PDMR is that it does not cause saturation at high pump powers as it is not limited by the lifetime of NV excited states but only by the recombination rates. This means that higher detection rates are achievable.

A further practical advantage of PDMR over ODMR is that it allows easier interfacing with electronics. Furthermore, higher resolution is achievable thanks to quadratic power dependence of photocurrent.

However, a limitation of PDMR is that in order to collect charge carriers from an excited spin defect, the spin defect must be located sufficiently close to a surface electrode to allow the charge carrier to drift through the diamond lattice and reach the surface electrode. Defects in the diamond limit the mobility of carriers and electric field penetration depth, thereby affecting the photocurrent. PDMR therefore currently has limitations in its use for a number of quantum applications.

SUMMARY

It is an object of the invention to provide a diamond sensor device that proves a more efficient way of collecting charge carriers during PDMR. This is achieved by providing electrodes within the bulk of a diamond material and proximate to a spin defect, allowing both the exploitation of 'bulk' spin defects and also the possibility of obtaining three dimensional positional information from within the diamond material.

According to a first aspect, there is provided a sensor device formed of diamond material. The sensor device comprises at least one spin defect located in the diamond material and an electrically conducting region located so as to be interactable with the spin defect, the electrically conducting region extending from an interior location of the diamond material to a surface of the diamond material. The electrically conducting region at the surface of the diamond material is arranged to connect to a detector, the detector configured to detect charge carriers excited from the at least one spin defect via the electrically conducting region.

An advantage of this type of sensor device is that it allows the use of a higher volume of the diamond sensor than would be the case if one were limited to using spin defects close to the surface, and also allows the collection of greater overall signals. Electric field penetration depth and charge carriers drift length strongly limit the number of usable sensing centres to those close to the surface using standard techniques. The invention allows the collection of signals from spin defects within the bulk of the diamond and provides an increase in overall signal, and ultimately sensitivity. Alternatively, signals from individual spin centres or groups of spin centres can be queried.

As an option, the diamond material comprises any of Chemical Vapour Deposition, CVD, diamond material, high pressure high temperature, HPHT, diamond, and natural diamond.

The electrically conducting region optionally comprises boron doped diamond. As a further option, the diamond material comprises at least one layer of boron doped diamond adjacent to a layer of diamond containing the at least one spin defect.

As an alternative option, the electrically conducting region comprises electrically conducting non-diamond carbon. As a further option, the electrically conducting non-diamond carbon comprises graphite.

As an option, the spin defect is selected from any of a negatively charged nitrogen vacancy centre, a silicon-vacancy centre, a tin-vacancy centre, a germanium-vacancy centre, a nickel related defect and a chromium-related defect.

As an option, the sensor device further comprises a plurality of spin defects located in the diamond material. As a further option, the sensor device comprises a plurality of electrically conducting regions extending from the interior location of the diamond material to the surface of the diamond material, each electrically conducting region being located so as to be interactable with a corresponding spin defect of the plurality of spin defects.

According to a second aspect, there is provided a method of forming a sensor device formed of diamond material, the method comprising:

- providing at least one spin defect located in the diamond material;
- providing an electrically conducting region located so as to be interactable with the spin defect, the electrically conducting region extending from an interior location of the diamond material to a surface of the diamond material;
- connecting the electrically conducting region at the surface of the diamond material to a current detector, the current detector configured to detect charge carriers excited from the at least one spin defect via the electrically conducting region.

As an option, the spin defect is selected from any of a negatively charged nitrogen vacancy centre, a silicon-vacancy centre, and defects related to nickel, tin, germanium or chromium.

The method optionally comprises growing a first layer of diamond material, the first layer comprising any of a spin defect and a precursor defect that is processable to become a spin defect, and growing a second layer of electrically conducting boron doped diamond adjacent to the first layer. As a further option, the processing comprises irradiating and annealing the diamond material to form the spin defect.

As an alternative option, the method comprises forming the electrically conducting region by forming electrically conducting non-diamond carbon in the diamond material. As a further option, the method comprises determining the location of a spin defect and subsequently providing the electrically conducting region by using a short-pulse laser to form a conducting non-diamond carbon path in the diamond material such that a portion of the conducting non-diamond carbon path is located so as to be interactable with the spin defect. This allows conductive tracks to be located close to individual spin defects. As a further option, the electrically conducting non-diamond carbon is formed by using a short-pulse laser.

The method optionally further comprises providing a plurality of spin defects located in the diamond material. As a further option, the method comprises providing a plurality of electrically conducting regions extending from the interior location of the diamond material to the surface of the diamond material, each electrically conducting region being located so as to be interactable with a corresponding spin defect of the plurality of spin defects.

BRIEF DESCRIPTION OF DRAWINGS

Non-limiting embodiments will now be described by way of example and with reference to the accompanying drawings in which.

DETAILED DESCRIPTION

The following description refers to sensors formed from diamond containing at least one spin centre. For convenience, the description refers to the exemplary spin centre being a negatively charged nitrogen-vacancy centre ($NV^-$). However, it is known that various spin centres can be formed in diamond. These include silicon-vacancy centres, tin-vacancy centres, germanium-vacancy centres, nickel related defects and chromium-related defects. The skilled person will appreciate that the structure and methods described herein apply to any type of spin centre that can be used in a diamond sensor.

The inventors have realised that PDMR can be optimised if charge collection does not just occur at an electrode disposed at the surface of the diamond, but if an electrically conducting region is provided within the body of the diamond. In this way, charge collection can be optimised to increase the collected signal and sensitivity, and more of the diamond can be utilized. Furthermore, individual spin centres in the diamond can be interrogated.

In order to function, the spin centres and the electrically conducting regions must be located within an interactable distance of one another. In practice, this typically means that they are within the drift length of a charge carrier in order for a charge carrier from the spin centre to reach the electrically conducting region and be detected.

Figure 1:
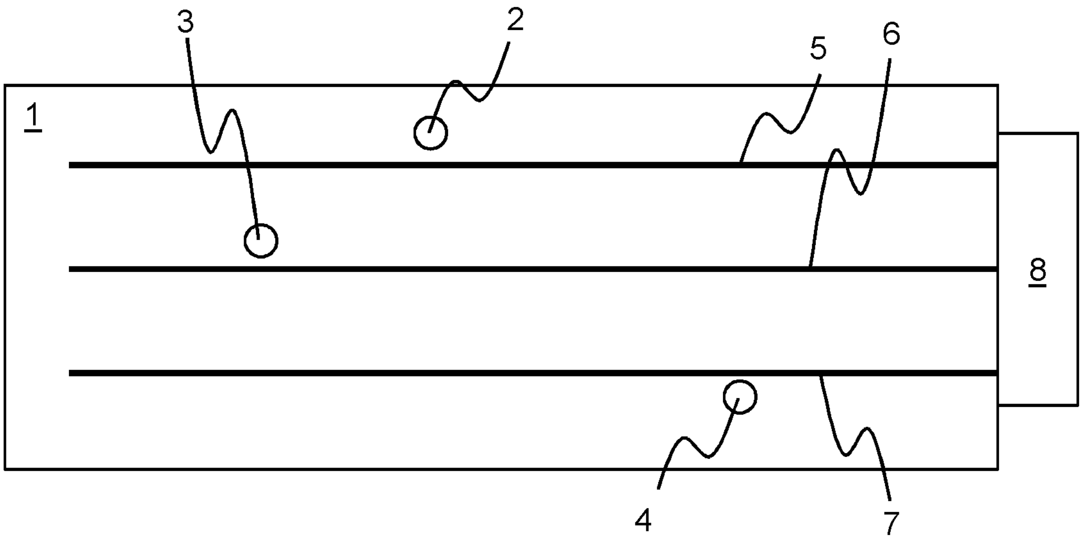
FIG. 1 illustrates schematically a side elevation cross section view of a diamond device in which electrically conductive regions are provided by electrically conducting non-diamond carbon tracks.

Referring to FIG. 1 herein, there is illustrated schematically a side elevation cross section view of a first exemplary diamond device 1. In this example, NV centres 2, 3, 4 are disposed within the body of the diamond 1. Electrically conducting non-diamond carbon is provided within the body of the diamond 1 in the form of tracks 5, 6, 7. The tracks 5, 6, 7 are electrically connected to an output device 8.

The electrically conducting regions may be provided, for example, by using a short pulse laser to convert diamond in the body to an electrically conducting carbon phase such as graphite. Such a technique is described in Bloomer et. al., "A single crystal CVD diamond x-ray beam diagnostic with embedded graphitic wire electrodes", 2054, 60058 https://doi.org/10.1063/1.5084689. Short-laser pulses can be used to selectively transform diamond to conductive graphite with micrometre accuracy. This can then be used to create conductive wires running in the x and y plane and at different depths, that can selectively excite and read separate regions containing NV centres of the diamond in all three dimensions. This technique can be used on any kind of diamond with the right spin centres, for example CVD diamond, natural diamond, or high pressure high temperature (HPHT) diamond.

Electrically conducting regions may be provided throughout the body of the diamond 1 so that on average, some will be in an interactable distance from an NV centre. Alternatively, the locations of the spin centres within the diamond may be determined and electrically conducting regions 5, 6, 7 can subsequently be formed within the diamond so as to be within an interactable distance of the NV centres 2, 3, 4.

The electrically conducting regions 5, 6, 7 may be connected such that all of the NV centres 2, 3, 4 within an interactable distance of any of the electrically conducting regions 5, 6, 7 can be queried at the same time. This increases the overall signal obtained and improves the sensitivity of the device. The electrically conducting regions may be connected in this way at the output device 8. Alternatively, and as shown in FIG. 2, the electrically conducting regions 5, 6, 7 may be connected to one another by further electrically conducting regions 9, 10 within the diamond 1 to ensure that the overall signal is optimized.

Alternatively, the electrically conducting regions 5, 6, 7 shown in FIG. 1 may be connected such that individual NV centres 2, 3, 4 or groups of NV centres can be queried by detecting charge carriers at individual electrically conducting regions 5, 6, 7. Typical applications include detecting gradients in B (or in RF field) or have one more dimension to apply a gradient in B (to do 3D RF sensing for example).

Figure 2:
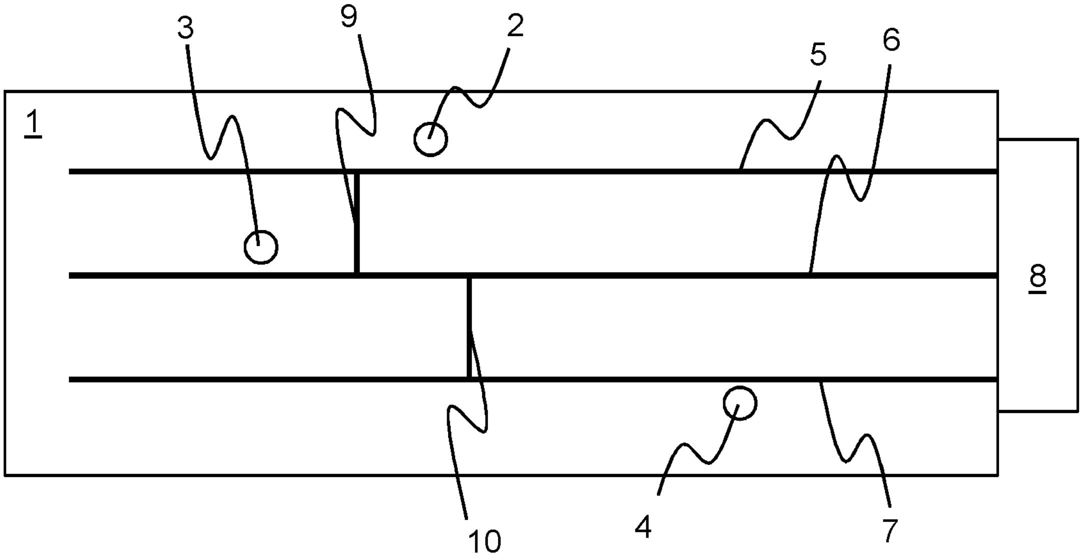
FIG. 2 illustrates schematically a side elevation cross section view of a diamond device in which electrically conductive regions are provided by electrically conducting non-diamond carbon tracks in an alternative configuration.

It will be appreciated that creating electrically conducting regions in an existing diamond, as shown in FIGS. 1 and 2, is not the only way to create electrically conducting regions. Where the diamond used is CVD diamond, electrically conducting regions can be created in the body of the diamond during the growth process.

Figure 3:
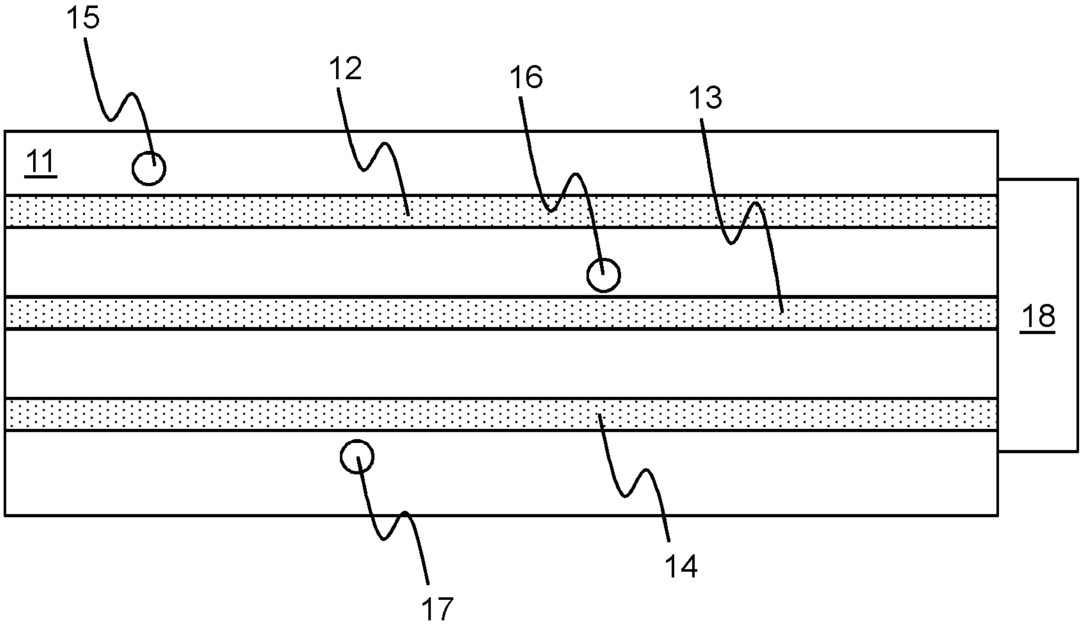
FIG. 3 illustrates schematically a side elevation cross section view of a diamond device in which electrically conductive regions are provided by layers of electrically conducting diamond.

Referring to FIG. 3 herein, there is illustrated schematically a side elevation cross section view of a diamond device in which electrically conductive regions are provided by layers of electrically conducting diamond. The diamond device 11 comprises layers 12, 13, 14 of electrically conducting diamond disposed between layers of dielectric diamond that contain the NV centres 15, 16, 17. This can be achieved during growth of CVD diamond by intermittently adding a boron-containing additive to the gases in order to form electrically conducting layers of boron doped diamond (BDD), as described more fully in, for example, WO 2014/044607.

The layers 12, 13, 14 of BDD are electrically connected to an output device 18. As with the embodiments shown in FIG. 1, each layer 12, 13, 14 can be used individually to query NV centres located within an interactable distance from the layer, or can be used together to increase the strength of the signal and the device sensitivity.

While the embodiment shown in FIG. 3 has two-dimensional layers of BDD running through the diamond, the skilled person will realise that by careful masking and overgrowth, three dimensional structures of BDD can be created throughout the body of the diamond 11. However, as a practical matter, three dimensional electrically conducting regions can be more cheaply and easily created by using a short pulse laser to create those regions within the diamond than growing them.

Figure 4:
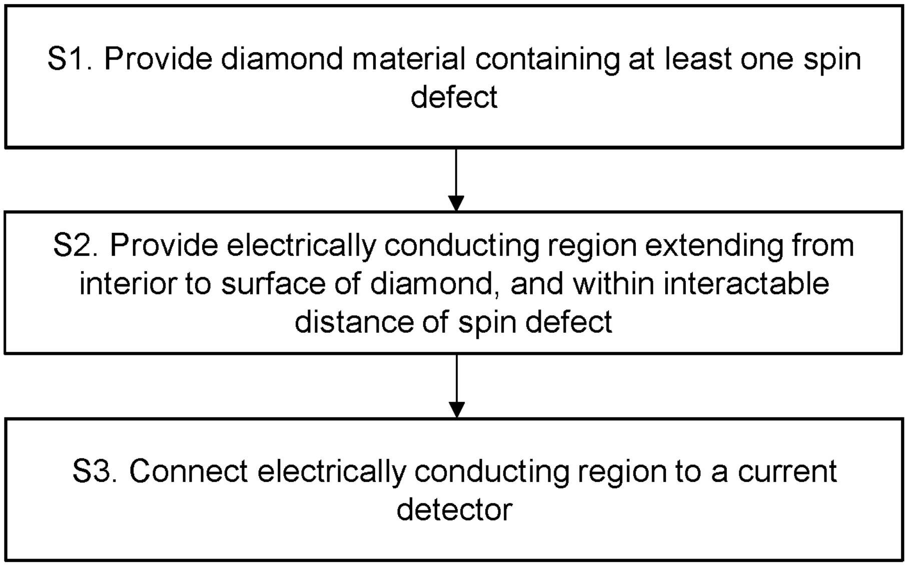
FIG. 4 is a flow diagram showing exemplary steps for forming a diamond sensor device.

Referring to FIG. 4 is a flow diagram showing exemplary steps for forming a diamond sensor device, described in general terms. The following numbering corresponds to that of FIG. 4:

S1. A diamond material is provided, that includes at least one spin defect located in the diamond material. Examples of spin defects include negatively charged nitrogen vacancy centres, silicon-vacancy centres, and defects related to nickel, tin, germanium or chromium.

S2. An electrically conducting region is provided in the diamond material. The electrically conducting region is located so as to be interactable with the spin defect, and extends from an interior location of the diamond material to a surface of the diamond material. This is required so that an electrical contact can be made with an output device.

S3. The electrically conducting region is connected at the surface of the diamond to a current detector. The current detector is configured to detect charge carriers excited from the at least one spin defect via the electrically conducting region.

As described above, several electrically conducting regions may be provided, and these may be used together to query the entire bulk of the diamond material in order to obtain a stronger signal, or may be used to selectively query different regions of the diamond material.

Figure 5:
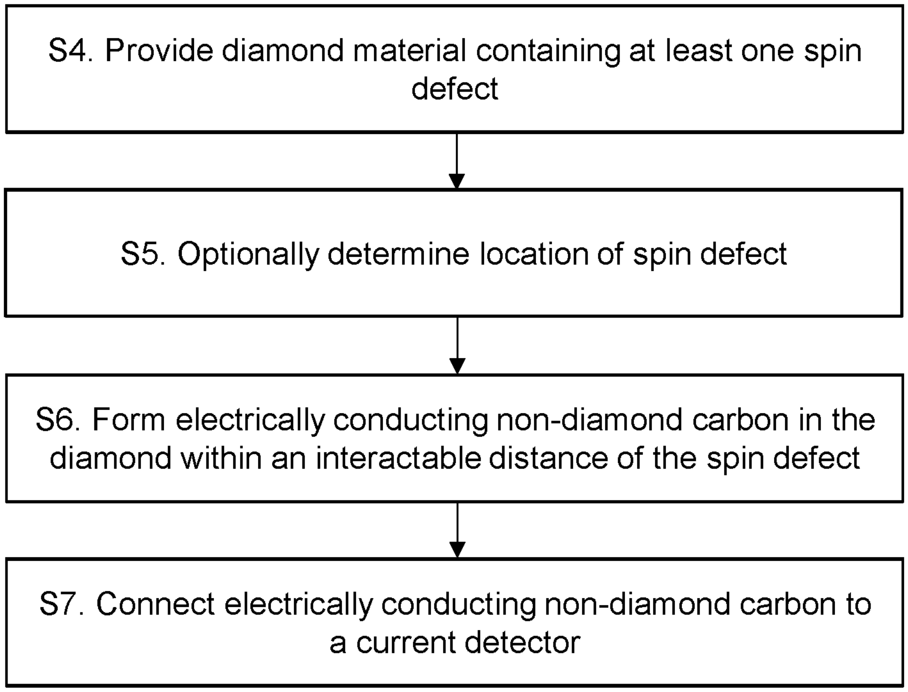
FIG. 5 is a flow diagram showing exemplary steps for forming a diamond sensor device in which electrically conductive regions are provided by electrically conducting non-diamond carbon tracks.

Turning now to FIG. 5, there is shown a flow diagram showing exemplary steps for forming a diamond sensor device in which the electrically conductive regions are provided by electrically conducting non-diamond carbon tracks as illustrated in FIGS. 1 and 2. The following numbering corresponds to that of FIG. 5.

S4. A diamond material is provided that contains at least one spin defect. The diamond may be CVD diamond, Natural diamond or HPHT diamond.

S5. In an optional embodiment, the location of the spin defect is determined prior to forming electrically conducting regions in the diamond.

S6. An electrically conducting region is provided within an interactable distance of the spin defect, for example by using a short-pulse laser to form electrically conducting non diamond carbon in the diamond material.

S7. The electrically conducting non diamond carbon is connected at a surface of the diamond to a current detector.

Figure 6:
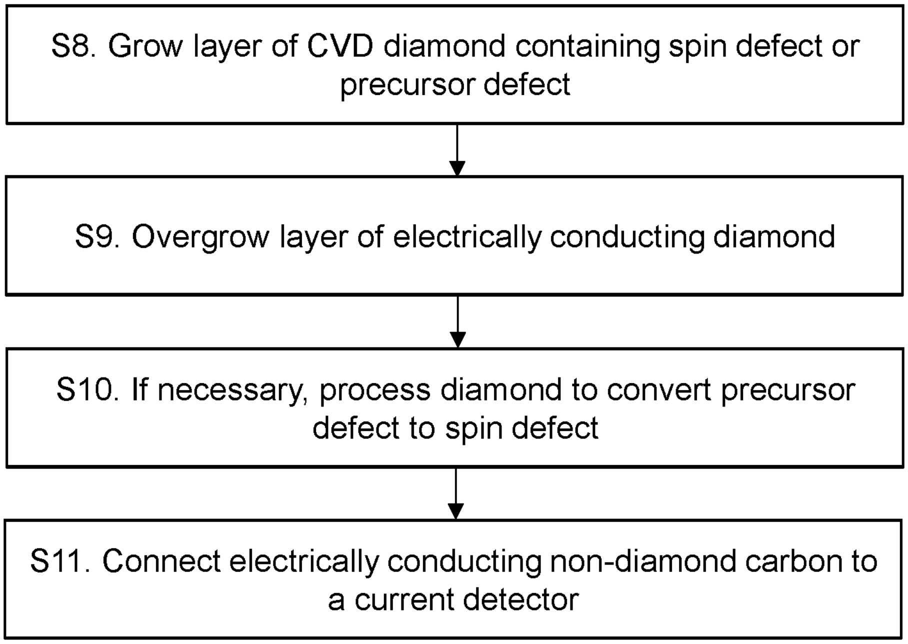
FIG. 6 is a flow diagram showing exemplary steps for forming a diamond sensor device in which electrically conductive regions are provided by layers of electrically conducting diamond.

Referring now to FIG. 6, there is shown a flow diagram showing exemplary steps for forming a diamond sensor device in which electrically conductive regions are provided by layers of electrically conducting diamond, such as BDD. The following numbering corresponds to that of FIG. 6.

S8. A first layer of CVD diamond is grown that contains at least one spin defect, or a defect that is processable to form a spin defect.

S9. A second layer of electrically conducting CVD diamond is overgrown on the first layer. Steps S8 and S9 can be repeated depending on how many layers of electrically conducting diamond are required. Furthermore, masking and overgrowth during the growth process can be used to build three dimensional electrically conducting regions within the diamond if required.

S10. If necessary, and precursor defects are grown in the diamond, then these are processed to become spin defects. For example, if a precursor defect is single substitutional nitrogen, then irradiation and annealing can cause the single substitutional nitrogen to form a pair with a vacancy and create an NV centre.

S11. The electrically conducting diamond layers are connected at a surface of the diamond to a current detector.

The invention as defined in the appended claims has been shown and described with reference to the embodiments above. However, it will be understood by those skilled in the art that various changes in form and detail may be made without departing from the scope of the invention as defined by the appended claims. While the above description focuses of a PDMR sensor, there are other useful applications. For example, such a sensor may be used to measure gradients of B through the Z direction or could be used to address? three dimensions in radio frequency sensing where a gradient of B is typically used in the in x and y directions, and the position of the magnetic resonance is determined to identify the RF frequency. This could also help address individual centres within the bulk of the material which can typically be useful to Quantum Information Processing or quantum communications.

The invention claimed is:

1. A sensor device formed of diamond material, the sensor device comprising:

a plurality of spin defects located in the diamond material;

a plurality of electrically conducting regions extending from an interior location of the diamond material to a surface of the diamond material, each electrically conducting region being located so as to be interactable with a corresponding spin defect of the plurality of spin defects;

wherein each electrically conducting region at the surface of the diamond material is arranged to connect to a detector, the detector configured to detect charge carriers excited from the plurality of spin defects via the corresponding electrically conducting region.

2. A method of forming a sensor device formed of diamond material, the method comprising:

providing a plurality of spin defects located in the diamond material;

providing a plurality of electrically conducting regions extending from an interior location of the diamond material to a surface of the diamond material, each electrically conducting region being located so as to be interactable with a corresponding spin defect of the plurality of spin defects;

connecting each electrically conducting region at the surface of the diamond material to a current detector, the current detector configured to detect charge carriers excited from the plurality spin defects via the corresponding electrically conducting region.

3. The sensor device according to claim 1, wherein the diamond material comprises any of Chemical Vapour Deposition, CVD, diamond material, high pressure high temperature, HPHT, diamond, and natural diamond.

4. The sensor device according to claim 1, wherein the electrically conducting region comprises boron doped diamond.

5. The sensor device according to claim 1, wherein the electrically conducting region comprises electrically conducting non-diamond carbon.

6. The sensor device according to claim 1, wherein each spin defect is selected from any of a negatively charged nitrogen vacancy centre, a silicon-vacancy centre, a tin-vacancy centre, a germanium-vacancy centre, a nickel related defect and a chromium-related defect.

7. The method according to claim 2, wherein each spin defect is selected from any of a negatively charged nitrogen vacancy centre, a silicon-vacancy centre, and defects related to nickel, tin, germanium or chromium.

8. The method according to claim 2, further comprising:

growing a first layer of diamond material, the first layer comprising any of a spin defect and a precursor defect that is processable to become a spin defect;

growing a second layer of electrically conducting boron doped diamond adjacent to the first layer.

9. The method according to claim 2, comprising providing the electrically conducting region by forming electrically conducting non-diamond carbon in the diamond material.

10. The sensor device according to claim 4, wherein the diamond material comprises at least one layer of boron doped diamond adjacent to a layer of diamond containing the at least one spin defect.

11. The sensor device according to claim 5, wherein the electrically conducting non-diamond carbon comprises graphite.

12. The method according to claim 8, wherein the processing comprises irradiating and annealing the diamond material to form the spin defect.

13. The method according to claim 9, further comprising determining the location of a spin defect and subsequently providing the electrically conducting region by using a short-pulse laser to form a conducting non-diamond carbon path in the diamond material such that a portion of the conducting non-diamond carbon path is located so as to be interactable with the spin defect.

14. The method according to claim 9, wherein the electrically conducting non-diamond carbon is formed by using a short-pulse laser.

* * * * *